(12) United States Patent
Sai et al.

(10) Patent No.: US 9,741,656 B2
(45) Date of Patent: Aug. 22, 2017

(54) HIGH-FREQUENCY INTEGRATED DEVICE WITH AN ENHANCED INDUCTANCE AND A PROCESS THEREOF

(71) Applicant: INDIAN INSTITUTE OF SCIENCE, Bangalore (IN)

(72) Inventors: Ranajit Sai, Bangalore (IN); Srinivasarao Ajjampur Shivshankar, Bangalore (IN); Navakanta Bhat, Bangalore (IN); Vinoy Kalarickaparambil Joseph, Bangalore (IN)

(73) Assignee: INDIAN INSTITUTE OF SCIENCE, Bangalore (IN)

( * ) Notice: Subject to any disclaimer, the term of this patent is extended or adjusted under 35 U.S.C. 154(b) by 269 days.

(21) Appl. No.: 14/441,329

(22) PCT Filed: Oct. 30, 2013

(86) PCT No.: PCT/IN2013/000664
§ 371 (c)(1),
(2) Date: May 7, 2015

(87) PCT Pub. No.: WO2014/068593
PCT Pub. Date: May 8, 2014

(65) Prior Publication Data
US 2015/0287658 A1    Oct. 8, 2015

(30) Foreign Application Priority Data
Nov. 1, 2012 (IN) .......................... 4570/CHE/2012

(51) Int. Cl.
*H01L 23/522* (2006.01)
*H01L 23/66* (2006.01)
(Continued)

(52) U.S. Cl.
CPC .......... *H01L 23/5227* (2013.01); *H01L 28/10* (2013.01); *H01L 23/5223* (2013.01);
(Continued)

(58) Field of Classification Search
CPC ............ H01L 23/5227; H01L 23/5223; H01L 23/5228; H01L 23/645; H01L 28/10;
(Continued)

(56) References Cited

U.S. PATENT DOCUMENTS 6,191,468 B1 * 2/2001 Forbes ................ H01F 17/0013
257/528
6,396,122 B1 * 5/2002 Howard .................. H01L 27/08
257/528
(Continued)

OTHER PUBLICATIONS

Yang et al., "On-Chip Soft-Ferrite-Integrated Inductors for RF IC", IEEE, Transducers 2009, pp. 785-788.*
(Continued)

*Primary Examiner* — Earl Taylor
(74) *Attorney, Agent, or Firm* — Sughrue Mion, PLLC

(57) ABSTRACT

The present invention provides a high-frequency integrated device, comprising a substrate including at least an on-chip active and passive member and a ferrite layer bonded to the substrate through an interfacial bridge and substantially wrapping plurality of surfaces of said at least on-chip active and passive members. The present invention also provides a system incorporating the high-frequency integrated device of the present invention. The present invention further provides a process for the preparation of the high-frequency integrated device.

31 Claims, 17 Drawing Sheets
(16 of 17 Drawing Sheet(s) Filed in Color)

(51) Int. Cl.
*H01L 49/02* (2006.01)
*H01L 23/64* (2006.01)

(52) U.S. Cl.
CPC ........ *H01L 23/5228* (2013.01); *H01L 23/645* (2013.01); *H01L 2924/0002* (2013.01); *H01L 2924/1421* (2013.01); *H01L 2924/19011* (2013.01); *H01L 2924/19041* (2013.01); *H01L 2924/19042* (2013.01); *H01L 2924/19043* (2013.01); *H01L 2924/30107* (2013.01)

(58) Field of Classification Search
CPC . H01L 2924/30107; H01L 2924/19043; H01L 2924/19042; H01L 2924/19041; H01L 2924/19011; H01L 2924/1421; H01L 2924/0002; H01L 23/66
See application file for complete search history.

(56) References Cited

U.S. PATENT DOCUMENTS

| | | | | |
|---|---|---|---|---|
| 6,534,406 | B1* | 3/2003 | Howard | H01L 23/5227 |
| | | | | 257/531 |
| 7,791,447 | B2* | 9/2010 | Gardner | H01F 17/0006 |
| | | | | 336/200 |
| 8,102,236 | B1* | 1/2012 | Fontana, Jr. | H01F 17/0006 |
| | | | | 336/200 |
| 8,470,612 | B2* | 6/2013 | Hofmann | H01F 41/046 |
| | | | | 257/531 |
| 8,610,533 | B2* | 12/2013 | Nussbaum | H01F 27/2804 |
| | | | | 212/233 |
| 8,952,504 | B2* | 2/2015 | Gu | H01L 43/02 |
| | | | | 257/659 |
| 9,093,975 | B2* | 7/2015 | Rogers | H03H 1/02 |
| 2003/0231093 | A1* | 12/2003 | Hsu | H01F 17/0006 |
| | | | | 336/200 |
| 2006/0017607 | A1* | 1/2006 | Hayata | G01S 7/282 |
| | | | | 342/41 |
| 2006/0257677 | A1* | 11/2006 | Choi | H01F 10/132 |
| | | | | 428/493 |
| 2007/0072005 | A1* | 3/2007 | Choi | B82Y 25/00 |
| | | | | 428/692.1 |
| 2007/0121249 | A1* | 5/2007 | Parker | G01R 33/04 |
| | | | | 360/123.1 |
| 2007/0202359 | A1* | 8/2007 | Choi | B82Y 25/00 |
| | | | | 428/692.1 |
| 2007/0247268 | A1* | 10/2007 | Oya | H01F 17/0006 |
| | | | | 336/200 |
| 2009/0278240 | A1* | 11/2009 | Kaneko | H01L 23/5227 |
| | | | | 257/659 |
| 2010/0225435 | A1* | 9/2010 | Li | H01F 17/0006 |
| | | | | 336/200 |
| 2010/0276791 | A1* | 11/2010 | Kaneko | H01L 23/5225 |
| | | | | 257/659 |
| 2012/0235880 | A1* | 9/2012 | Kim | H01Q 1/38 |
| | | | | 343/884 |
| 2012/0248570 | A1* | 10/2012 | Golubovic | H01F 17/0006 |
| | | | | 257/531 |
| 2013/0323884 | A1* | 12/2013 | Karpman | H01L 21/78 |
| | | | | 438/113 |
| 2015/0287658 | A1* | 10/2015 | Sai | H01L 28/10 |
| | | | | 455/127.2 |

OTHER PUBLICATIONS

Yang et al., "Investigation of On-Chip Soft-Ferrite-Integrated Inductors for RF ICs—Part I: Design and Simulation", IEEE Transactions on Electron Devices, vol. 56, No. 12, 2009, pp. 3133-3140.*
Yang et al., "Investigation of On-Chip Soft-Ferrite-Integrated Inductors for RF ICs—Part II: Experiments", IEEE Transactions on Electron Devices, vol. 56, No. 12, 2009, pp. 3141-3148.*
Yang et al. "Ferrite-Integrated On-Chip Inductors for RF ICs", IEEE Electron Device Letters, vol. 28, No. 7, 2007, pp. 652-655.*
Cai et al., "Application of Ferrite Nanomaterial in RF On-Chip Inductors", Journal of Nanomaterials, 2013, pp. 1-12.*
Liu et al., "NiCuZn ferrite thin films for RF integrated inductors", Materials Letters, 60, 2006, p. 1403-1406.*
Yaya et al., "Design, Manufacturing and characterization of integrated inductors with magnetic layers for DC-DC converter", Advanced Electromagnetics, vol. 1, No. 2, 2012, pp. 58-63.*

* cited by examiner (a) (b)

L5_7_250_Dep3

L10_2_250_Dep3

L10_4_250_Dep3

L10_4_650_Dep3

HIGH-FREQUENCY INTEGRATED DEVICE WITH AN ENHANCED INDUCTANCE AND A PROCESS THEREOF

CROSS REFERENCE TO RELATED APPLICATIONS

This application is a National Stage of International Application No. PCT/IN2013/000664, filed on Oct. 30, 2013, which claims priority from Indian Patent Application No. 4570/CHE/2012, filed on Nov. 1, 2012, the contents of all of which are incorporated herein by reference in their entirety.

TECHNICAL FIELD

The present invention relates to a high-frequency integrated device, with strongly adherent layers of ferrite and a metals-containing oxide, bonded to a substrate. The present invention also provides a system to receive and transmit Radio Frequency (RF) signals with high-frequency integrated device of the present invention. The present invention further relates to method of preparing the high-frequency integrated device with adherent layers of ferrite and an oxide of a metal, at low temperatures.

BACKGROUND OF THE INVENTION

Radio-frequency Integrated Circuits (RF-ICs) are widely used in the field of telecommunications, as they form an essential constituent of the signal transmission/reception block. High-frequency or RF inductors are one of the key elements for signal processing, particularly in radio frequency analog circuits, such as filters, impedance-matching circuits, amplifiers and transformers. Inductor elements in RF-ICs are made of miniature metal loops fabricated through well-known lithographic processes.

In general, RF inductors consume a large fraction of real estate in IC chips and, therefore, it is very desirable to achieve the maximum possible level of compactness and efficiency in their design and fabrication. Presently, a higher value of inductance per unit area (inductance density) is the preferred characteristic of RF inductors. In order to achieve this characteristic, a suitable magnetic material is to be used as the inductor core. Thus, inductor loops may be enclosed in a suitable magnetic core material to enhance the inductance of the metal loop inductor. This approach obviates the need for a substantial redesign of inductor geometry, which would otherwise be necessary to increase inductance density. Any alteration of device geometry eventually leads to fabrication complexity or uncontrollable parasitic effects or both.

Magnetic alloys, such as Permalloy and a wide range of compositions in the amorphous Co—Zr—Nb-alloy system are potential candidates for the inductor core required to enhance inductance/area (inductance density). Thin films of these materials, prepared by various methods have been studied for their magnetic behaviour in the frequency range from a few MHz to a few GHz.

However, it has been recognized that the negative effect of power loss in the core made of such electrically conducting alloys more than offsets the positive effect of their high permeability to the performance of a circuit operating at GHz frequencies. This has prompted investigations into the use of a magnetic material with very high electrical resistivity as the inductor core, rather than metallic alloys like N—Fe and Co—Zr—Nb.

Ferrites are known for their magnetic and electrical properties (including high magnetization density and high electrical resistivity) and have been used in high frequency circuits as the magnetic core. However, in view of the miniaturization of such devices and the development of on-chip planar inductor structures, the available technology of ferrite film fabrication has not been found to be adequate to meet the high frequency operations. One of primary reasons for this inadequacy is the high-temperature processing required for the formation of crystalline ferrites such as thin ferrite films that are normally required in RF-ICs, which is incompatible with today's Complementary metal-oxide-semiconductor (CMOS) technology with its aggressive device feature sizes.

Alternately, the RF magnetron sputtering route is employed to deposit ferrite films, on such devices. However, in this method, high temperature post-deposition processing is required, which is not compatible with presently-used CMOS RF-ICs having aggressive geometries.

Electron Cyclotron Resonance (ECR) microwave plasma-enabled sputtering, which is a modified sputtering method meant to reduce the processing temperature of the ferrite film deposition, is also employed. However, the relatively low deposition rate of the process imposes a major deterrent, as it raises fabrication cost significantly.

Pulsed laser deposition (PLD) is another method that can form ferrite films at temperatures that may be low enough to be compatible with today's CMOS technology. However, this method is associated with scalability issues, making it incompatible with large-scale device fabrication.

Spin-spray plating of ferrite is another known method devised to meet the need for a low-temperature process for ferrite film formation. While scalable, the chemistry of the process requires an oxidizing agent such as hydrogen peroxide ($H_2O_2$) and a pH modifier, preferably a base, making the method incompatible with Si substrates and with lithographed metal coils forming the miniature inductors in RF-ICs. However, achieving sufficient and strong adherence of the resulting ferrite film to the substrate, using this process, has become a significant challenge.

In view of the non-uniformity of the grain size of a ferrite material that usually results from the different processes listed above used to incorporate (in the form of a thin film) in a device such as an inductor, the result is often a material having an undesirably high degree of porosity or a low degree of flatness or both. Porosity reduces inductance per unit area that can be attained in RF-CMOS circuit, where "chip real estate" is precious. A low degree of film flatness generally makes IC processing more expensive.

In addition, when a desirable ferrite composition, namely $ZnFe_2O_4$, attains a grain size of about 50 nm and above due to being processed at elevated temperatures and under conditions of thermodynamic equilibrium, it becomes an anti-ferromagnet at low temperatures and possesses low permeability at room temperature. Therefore, such a material or composition has a limited use as a magnetic core material in RF-ICs.

Magnetic inductor cores made of metal alloys such as N—Fe and Co—Zr—Nb, when used as inductor core in RF-CMOS systems, suffer due to electrical losses at higher frequencies because of their low electrical resistance.

In a known microwave-assisted process to prepare a nanostructured ferrite film composition, a mixture of alcohols is employed as a solvent. However, such a process is faced with a problem of agglomeration of ferrite grains resulting in a non-uniform grain size of the ferrite grains.

In addition, the materials thus prepared using known processes require post-deposition treatment, such as annealing at elevated temperatures, thus making the IC fabrication process CMOS-incompatible.

The energy consumed in processes that use vacuum-based techniques that are used to deposit thin films on a substrate is high, since the creation and sustenance of the required vacuum levels is very energy-intensive and thus expensive as well.

Gardner. D et. al., in Review of On-chip Inductor Structures with Magnetic Films IEEE Transactions on Magnetics 45, 4766 (2009), discloses a series of magnetic inductor structures capable of operating frequencies up to 1 Ghz.

U.S. Pat. No. 7,438,946 and JP61-030674 disclose a method of depositing ferrite material on a substrate at a low temperature.

OBJECTS OF THE PRESENT INVENTION

The primary object of the present invention is to provide a high-frequency integrated device with strongly adherent layers of a ferrite and an oxide bonded to substrate including an on-chip active and passive member, to exhibit an enhanced inductance.

An object of the present invention is to provide a high-frequency integrated device with a homogenous, non-porous, uniformly-grained magnetic core film (coating) for wrapping on-chip active and passive members, whereby they exhibit an enhanced inductance when used in high-frequency RF-CMOS integrated circuits.

Another object of the present invention is to provide a high-frequency integrated device with strongly adherent layers of ferrite and of a metals-containing oxide bonded to substrate exhibiting higher electrical resistance and lower electrical losses, while operating at higher frequencies.

Yet another object of the present invention is to provide a system to receive and transmit Radio Frequency (RF) signals coupled with the high-frequency integrated device of the present invention.

It is also an object of the present invention to provide a process for the preparation of a high-frequency integrated device with strongly adherent layers of a ferrite and a metals-containing oxide bonded to substrate, at low temperatures and without encountering the agglomeration of ferrite grains.

SUMMARY OF THE INVENTION

The present invention provides a high-frequency integrated device, comprising a substrate including at least an on-chip active and passive member and a ferrite layer bonded to the substrate through an interfacial bridge and substantially wrapping plurality of surfaces of said at least on-chip active and passive members. The present invention also provides a system incorporating the high-frequency integrated device of the present invention. The present invention further provides a process for the preparation of the high-frequency integrated device.

BRIEF DESCRIPTION OF THE DRAWINGS

The patent or application file of this patent contains at least one drawing executed in color. Copies of this patent with color drawing(s) will be provided by the Patent and Trademark Office upon request and payment of the necessary fee.

DETAILED DESCRIPTION OF THE INVENTION

Figure 1:
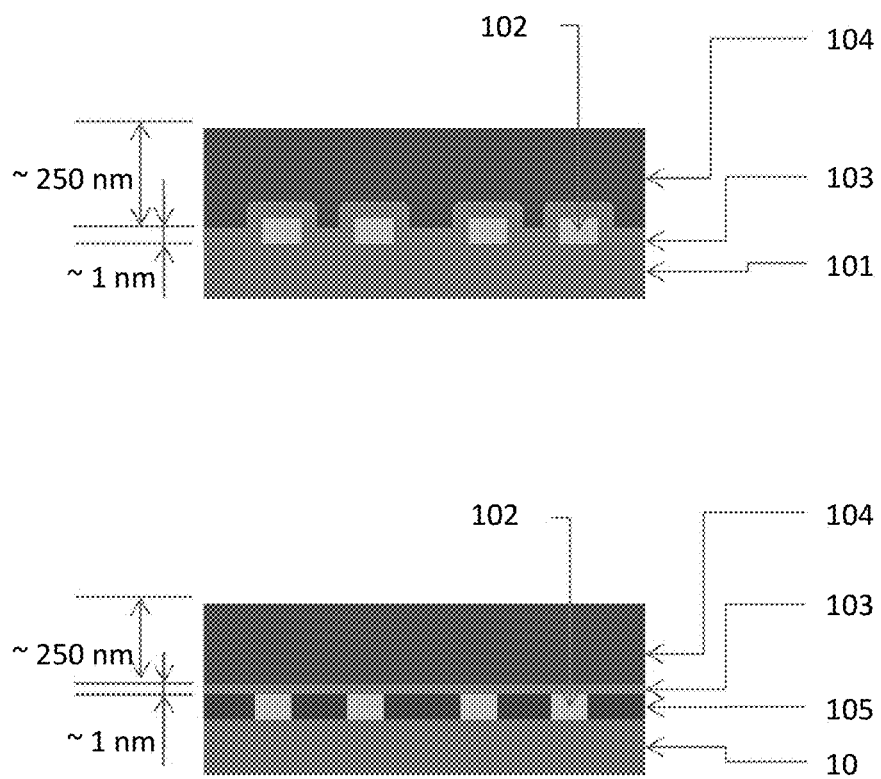
FIG. 1 is a schematic depiction of an exemplary high-frequency integrated device with an on-chip passive member that is bonded to substrate and wrapped with adherent layers of film material of the present invention.

The preferred embodiments of the present invention are now described by referring to accompanied drawings. Initially, by referring to FIG. 1, the high-frequency integrated device of the present invention, with on-chip active and passive members mounted on its substrate and wrapped with strongly adherent layers of a ferrite and a metals-containing oxide, is now described. In the present invention the usage of the term "high-frequency integrated device (HFID)", refers to a Complementary Metal-Oxide-Semiconductor (CMOS) device, adapted to be incorporated in radio frequency circuits, particularly in telecommunication systems, and operable at a wide ranges frequencies, in the range of about 1-100 GHz. The HFID of the present invention, which is wrapped with a magnetic oxide film, at very low temperatures, possesses a desirable morphology viz., a flat surface supported by a uniform grain structure of the material, which is non-porous and uniformly-sized, arranged to receive and transmit Radio Frequency (RF) signals, while used in RF-ICs of telecommunication systems.

In an aspect of the present invention the primary objective is therefore to provide a HFID, which is wrapped with suitable magnetic oxide film material at temperatures that are conducive for the sustenance of Complementary Metal-Oxide-Semiconductor (CMOS) devices.

Accordingly, the HFID 100 of the present invention comprises a substrate 101, which is made of an element, a compound, or an alloy, selected from semiconductor materials such as Silicon (Si), Germanium (Ge) or a combination thereof. In the present invention, as an exemplary embodiment, Silicon (Si) is used for the substrate 101.

Once a suitable substrate 101 is selected, a plurality of on-chip active and/or passive device elements 102 is mounted on the substrate 101. The term "on-chip active member", as used in the description, refers to semiconductor device such as a transistor and whereas the term "on-chip passive member" refers to electrical components that are used in ICs, such as capacitors, resistors, inductors and the like. In other words, passive members are integral part of HFID, acting either as an energy-storing component or an energy-dissipating component, or a combination of both. These on-chip active and passive members, by their nature come in different shapes and sizes. Particularly, an on-chip passive device such as an inductor or a coil, which is normally shaped to enhance its magnetic field, possesses windings that are defined by plurality of tiny crevices or corners, between the elements of the coil. In the instant invention, as an exemplary manner, an inductor is used as one of the on-chip passive members, which is coated with film material of the present invention to demonstrate the display of enhanced inductance while used in conjunction with High-Frequency Integrated Device (HFID). It is understood here that other on-chip active and passive members can be suitably coated with film material of the present invention.

In another aspect of the present invention, the film material that is used to wrap the on-chip active and passive members of the HFID of the present invention, is a ferrite material of general formula ($AB_2O_4$), wherein A is Mn, Ni, Co, Cu, Zn, Cr, Fe or a combination of thereof and B is Fe having the characteristics as hereinafter described. In an exemplary embodiment, in the present invention, a coating of nanostructured Zinc Ferrite ($ZnFe_2O_4$) is used to wrap the on-chip active and passive device elements 102 of the HFID.

In yet another aspect of the present invention, an interfacial bridge 103, is formed and bonded to the substrate 101. The interfacial bridge 103 is a thin layer of an oxide formed by the metals in ferrite layer and elements in the substrate 101. In the instant case, the oxide of iron is a silicate (considering the silicon as the substrate material and $ZnFe_2O_4$ as the coating film material). The silicate layer 103 arises out of chemical interaction between Si and the ferrite, thus rendering a strong adhesion with substrate 101 on one side and with the ferrite film (magnetic oxide film) on the other side. The thickness of the interfacial bridge 103 is in the range of about 0.5 to 2 nm. The presence of silicon in the interfacial bridge 103 at the interface between the magnetic oxide film and the silicon substrate 101, establishes the participation of the silicon in the formation of the interfacial bridge 103. It is notable here that substrates 101 made of elemental semiconductors such as Ge, with chemical characteristics similar to those of Si, are also expected to behave similarly and to form an interfacial bridge 103 that provides strong bonding of the magnetic oxide layer with the substrate 101.

In another aspect of the present invention a metal ferrite layer 104, which is a zinc ferrite layer, (as derived from $ZnFe_2O_4$) is adhered to the interfacial bridge 103.

Figure 2:
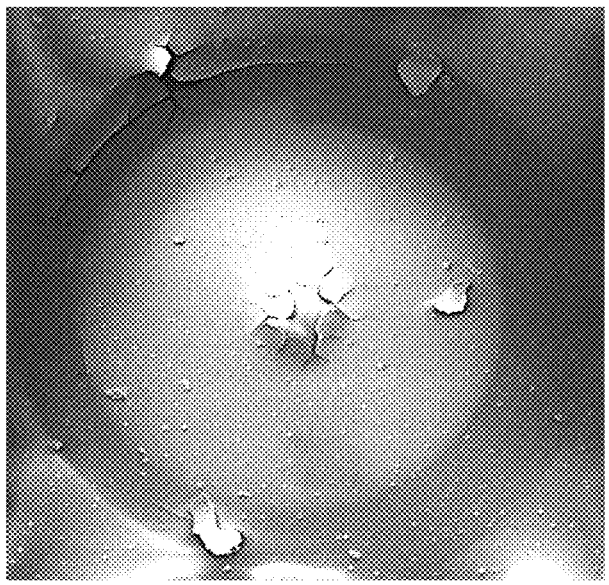
FIG. 2 depicts Scanning Electron Microscope (SEM) images of exemplary high-frequency integrated device with on-chip passive members, wrapped with adherent layers of film material of the present invention.
Figure 2:
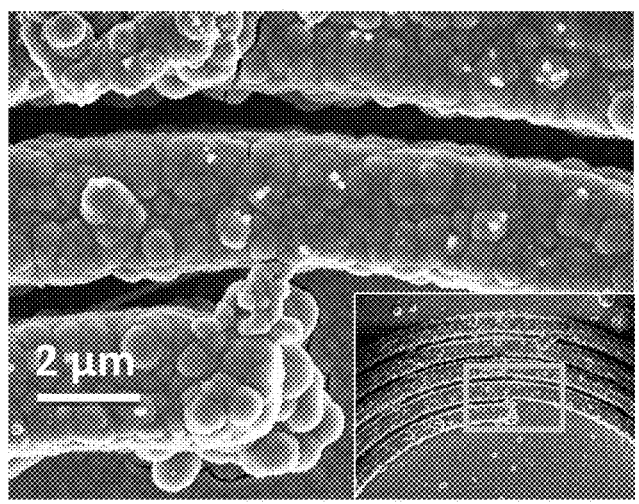

In further aspect of the present invention the layered-structure of magnetic film (ferrite film) of the present invention that substantially wraps the on-chip passive member 102, which is an inductor, is shown in shown in FIG. 2(a) and FIG. 2(b). In this aspect the substrate 101 of the HFID 100 is provided with an inductor 102, which is substantially wrapped with the ferrite film of the present invention. FIG. 2 (a) provides an SEM image of the top portion of the inductor 101 bearing the film deposition and whereas FIG. 2 (b) depicts a magnified side view of the inductor 101 subsequent to the substantial wrapping of inductor 101 with the ferrite film. It can be seen from these figures, the extent of wrapping of the inductor 102 with the ferrite film, which substantially permeates through the crevices and corner portions of the inductor 102, which hitherto considered as impermissible zones or areas and envelopes the inductor 102 in a comprehensive manner, to enhance the inductance of the coil.

Figure 3:
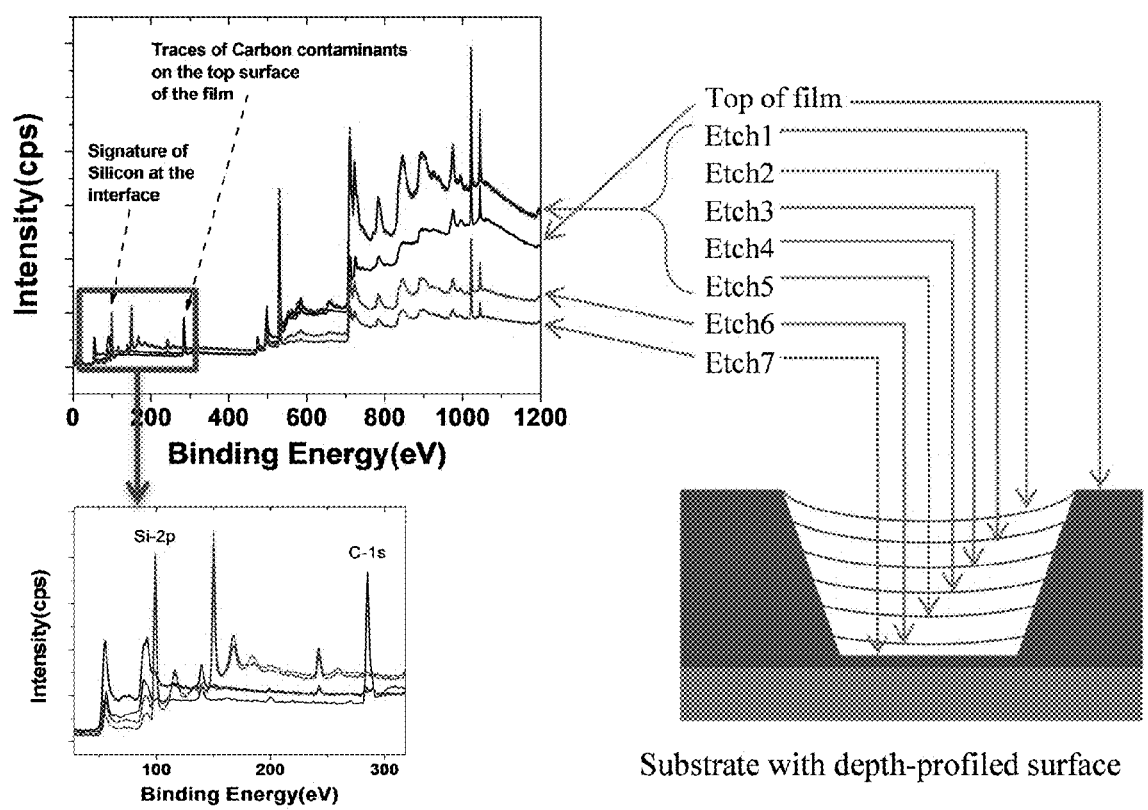
FIG. 3 is a schematic drawing exhibiting depth-profile of the film bonded to an exemplary high-frequency integrated device along with a survey spectrum.

In further aspect of the present invention, the depth profiling of the HFID 100 coated with the ferrite film (as derived from $ZnFe_2O_4$) of the present invention, is performed, and results are plotted in FIG. 3. The XPS depth profiling is undertaken to identify the constituent elements of various zones viz., substrate 101, interfacial bridge 102 and magnetic oxide film (ferrite film) 103. In other words, XPS depth profiling as undertaken to gather data gathered at different depths of the zinc ferrite that is coated coating on silicon substrate 101, commencing from the top or peripheral surface of the film and down to the film-Si interface. The aforementioned depth profiling has provided a chemical picture of the magnetic oxide film of the present invention i.e., the state of bonding of different elements to one another. As shown in FIG. 3, the constituent elements are zinc, iron, oxygen and silicon. The presence of silicon in the thin layer 102 at the interface between the magnetic oxide film and the silicon substrate 101 confirms the participation of the silicon in the formation of the interfacial bridge 102.

Figure 4:
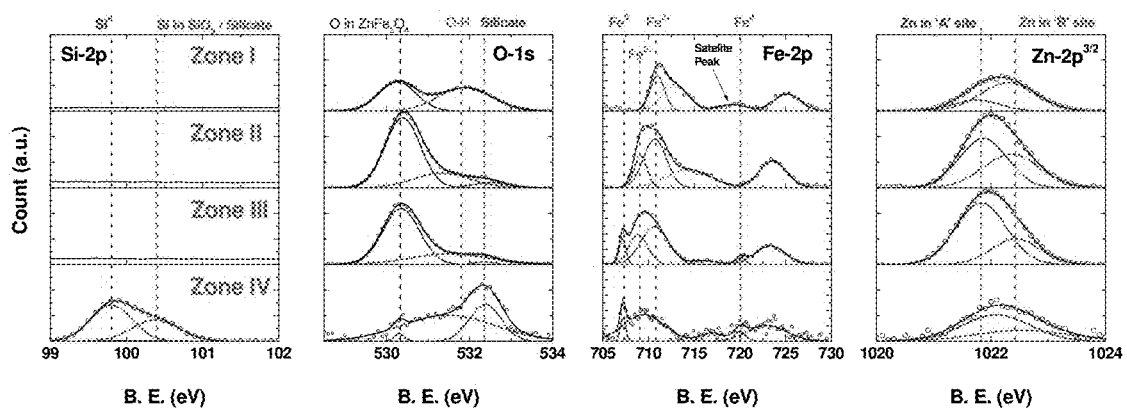
FIG. 4 depicts an X-ray Photoelectron Spectroscopy (XPS), demonstrating various elemental zones of exemplary high-frequency integrated device with on-chip passive member, wrapped with adherent layers of film material of the present invention.

In another aspect of the present invention as shown in FIG. 4, which is an XPS data for the film deposited by the microwave-assisted process of the present invention and collected from the various Zones viz., Zones I, II, III and IV, establish the fact of variation in the film composition across the zones. The spectra corresponding to different zones or depths of the zinc ferrite film are viz., Zone I indicates the top surface of the film, Zones II and III are directed to the body of the film and whereas Zone IV points to the film-substrate interface. It can be observed here that the regions of the spectra as shown FIG. 4 correspond to the four relevant elements viz., zinc, iron, oxygen and silicon. Each of the vertical panels contains the spectrum of one of these 4 elements taken in the 4 different Zones. It is evident from the data that Si is present only on the substrate 101 i.e., Zone 4, and not in other zones.

In yet another aspect of the present invention the spectral lines as shown in FIG. 4 denote peaks of different shapes. These can be de-convoluted into Gaussian shapes, the sum of which is the original envelope. Therefore, the Zn "peak" can be split into two "peaks", as noted in the foregoing, to show that Zn is present in two different crystallographic positions in zinc ferrite, which establishes the fact of partial inversion. The two peaks into which the Si line at the interface splits, establishes the presence of $SiO_2$ and a silicate, a compound of Si, Fe, O and Zn.

Figure 5:
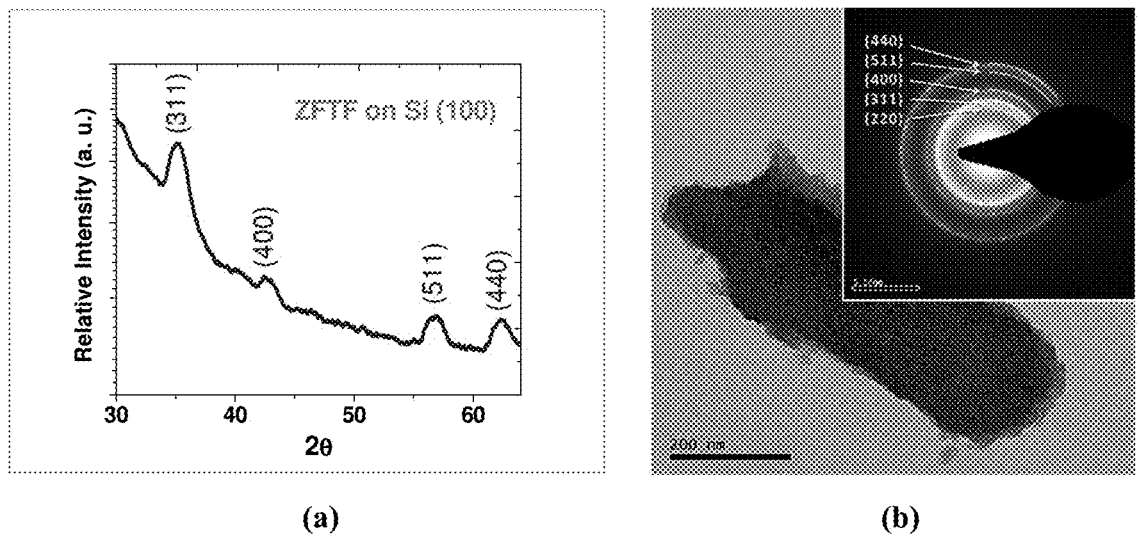
FIG. 5($a$) is an X-Ray diffraction (XRD) pattern of a representative magnetic layer and whereas FIG. 5($b$) is a corresponding Transmission Electron Microscopy (TEM) image and Selected Area Electron Diffraction (SAED) pattern, demonstrating nanocrystalline grain structure with spinel ($AB_2O_4$) structure.

In further aspect of the present invention compositional and crystallographic analysis of the magnetic oxide layer of the an exemplary sample (HFID), designated as ZFTF1 is performed and results are shown in FIG. 5(a), which represents an x-ray diffraction (XRD) pattern of the zinc ferrite film deposited by the method of this invention. The pattern is characteristic of zinc ferrite, consistent with the cubic structure of the ferrite and with the database. That the "peaks" are not sharp, but have a certain width, is indicative that the ferrite is nanocrystalline. This is according to the well-known Debye-Scherrer formula, which teaches that the width of XRD peaks is inversely proportional to the average size of the grains in the sample. From this formula, the grain size in the present sample is deduced to be about 5 nm. It is also well known in the relevant literature that, at such a small grain size, zinc ferrite is crystallographically inverted. The results of XRD thus confirm composition of the said layer as zinc ferrite, in a nanocrystalline form, which assumes the spinel ($AB_2O_4$) structure with a certain degree of crystallographic inversion.

In yet another aspect of the present invention the TEM analysis of a small chunk of zinc ferrite film peeled off from a coated HFID, is performed and the results are shown in FIG. 5(b). The "ring pattern" of electron diffraction in this figure confirms the presence of zinc ferrite which is nanocrystalline, as indicated by the TEM image of the "chunk" that is shown alongside.

Figure 6:
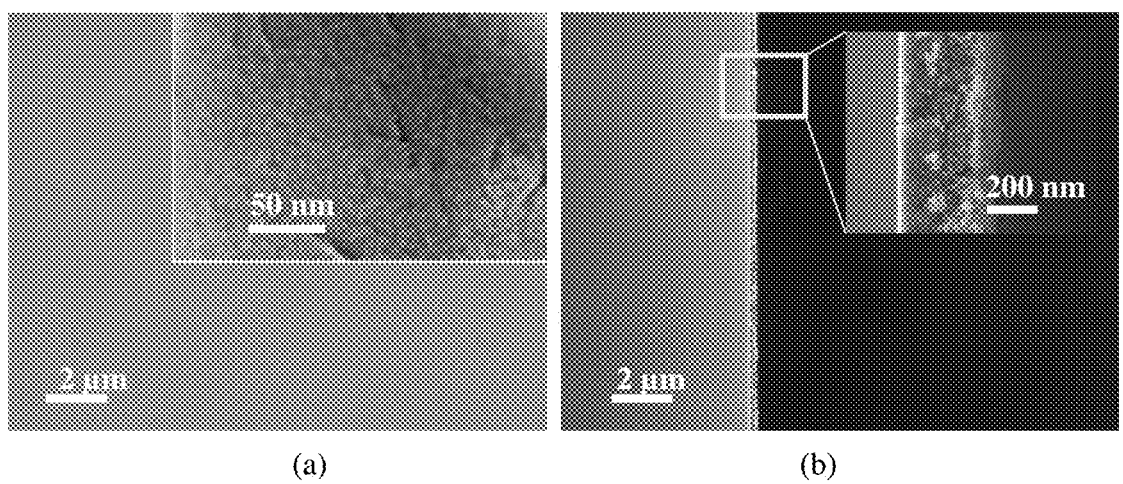
FIG. 6 ($a$) is a Scanning Electron Microscope (SEM) image of the deposited film material of the present invention and whereas FIG. 6($b$) depicts the corresponding high-resolution image of the film material.

In further aspect of the present invention the magnetic oxide layer is subjected to SEM imaging to ascertain uniform grain structure of the film composition. It can be seen from FIG. 6(a) and FIG. 6(b) that the magnetic oxide film is smooth, non-porous and comprises uniform nanostructured grains. The cross-sectional SEM image in FIG. 6(b) shows clearly that the thickness of the zinc ferrite layer is very uniform, which leads to a "smooth coating". The average grain size of the deposited crystallites is found to be in the range of about 5 nm, with an average surface roughness in the range of about 4 nm for a film of thickness of about 500 nm.

Figure 7:
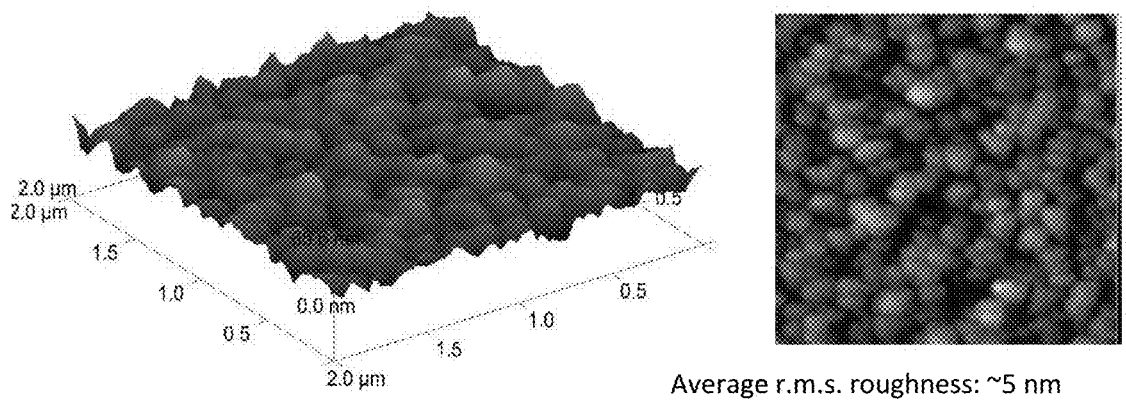
FIG. 7 is an Atomic Force Microscopy (AFM) image of a representative magnetic layer of the film exhibiting surface morphology.

The average surface roughness of 4 nm cited above is derived from atomic force microscopy (AFM) analysis and the results are shown in FIG. 7, which establishes uniform grain size and smooth surface morphology of the ferrite film.

Figure 8:
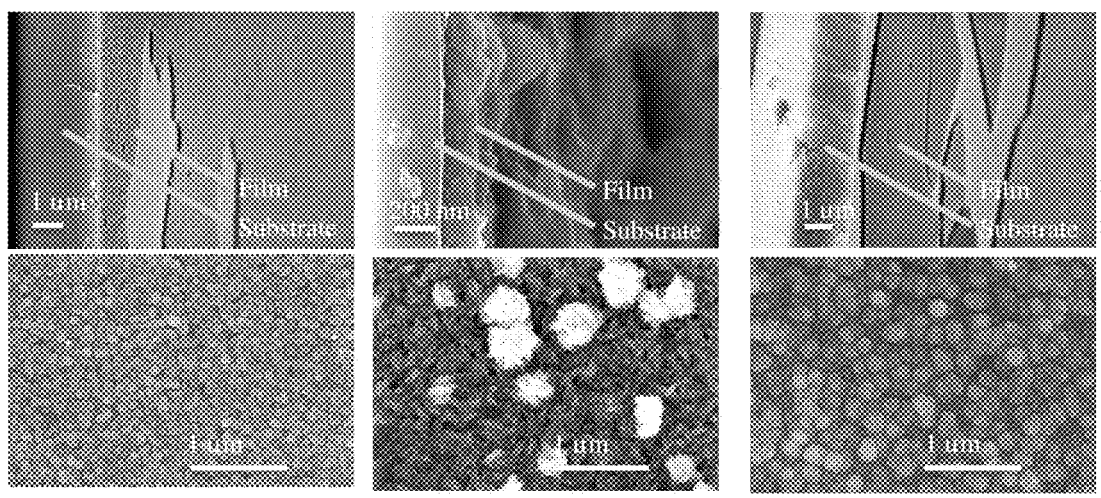
FIG. 8 depicts Scanning Electron Microscope (SEM) images of exemplary film materials of the present invention with different types of surfactants.

In yet another aspect of the present invention, the magnetic oxide film that is formed in the presence of a surfactant for instance, Polyvinylpyrrolidone (PVP), which may vary the characteristics of the deposited film as demonstrated in FIG. 8, which based on the data collated from Table 1.

TABLE 1

| Sample Name | Amount of precursor in 250(water:ethanol = 1:4) ml solvent $Zn(acac)_2$/ $Fe(acac)_3$ | Surfactant used Name/Qty. (in g/100 ml) | Microwave exposure Power (W)/ Time(min) | Film thickness (in nm) |
|---|---|---|---|---|
| ZFTF1 | (1.5/3) mmol | PVP K-15 (0.1 g/ 100 ml) | 640 W/ 10 min | 120 nm |
| ZFTF2 | (1.5/3) mmol | PVP K-56 (0.1 g/ 100 ml) | 640 W/ 10 min | 175 nm |
| ZFTF3 | (1.5/3) mmol | PVP K-90 (0.1 g/ 100 ml) | 640 W/ 10 min | 110 nm |
| ZFTF4 | (4/8) mmol | PVP K-90 (0.1 g/ 100 ml) | 640 W/ 10 min | 620 nm |
| ZFTF5 | (4/8) mmol | PVP K-90 (0.4 g/ 100 ml) | 640 W/ 10 min | 18000 nm |

Figure 17:
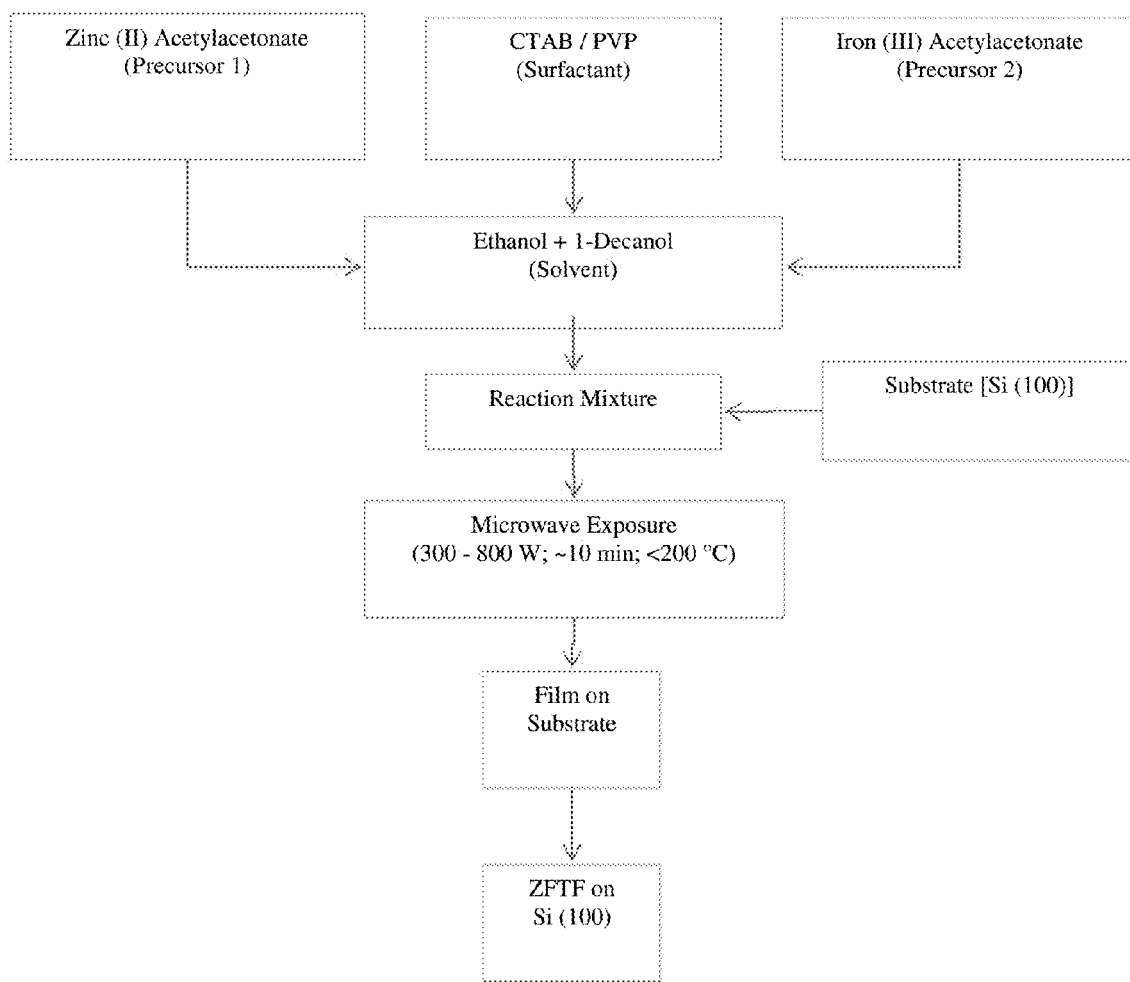
FIG. 17 is the graphical representation of process steps for the preparation of a high-frequency integrated device with strong adherent layers of ferrite and an oxide of a metal bonded to substrate.

SEM imaging of different films, showing the effect of differing mol. wt. of the surfactant PVP is shown in FIG. 8. The coatings of zinc ferrite as shown in FIG. 8(a), (b), (c), respectively, indicate the deposition of zinc ferrite films with PVP of mol. wt. 15,000, 55,000, and 360,000, added to the reaction solution, while following the deposition protocol as shown in FIG. 17. These examples show that the morphology of the ferrite film can be altered by altering the composition of the solution that is subjected to microwave irradiation.

Figure 9:
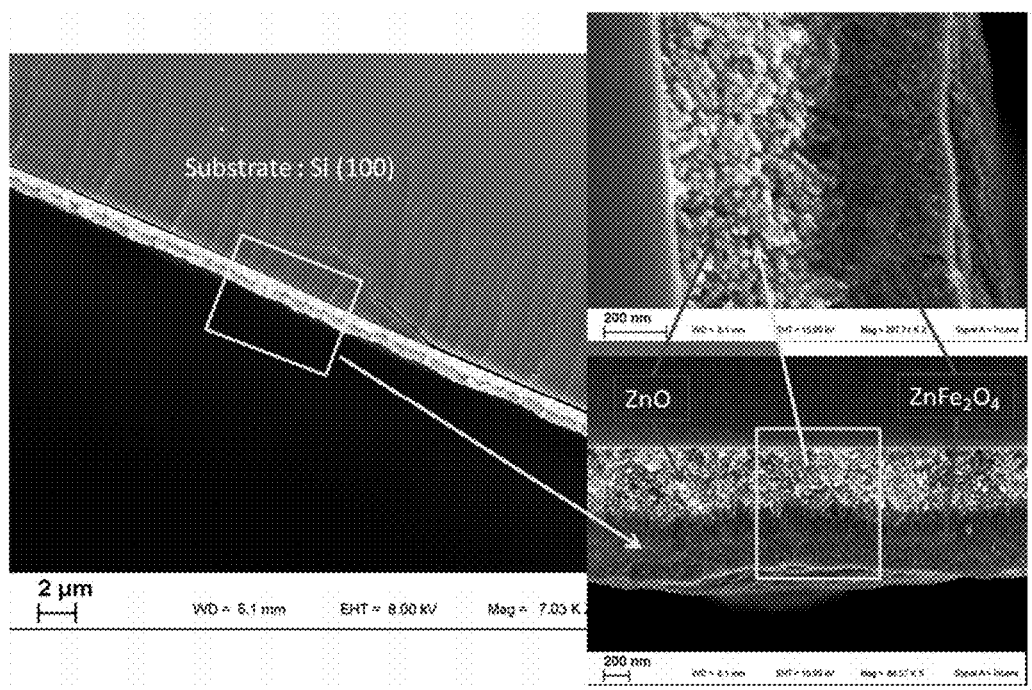
FIG. 9($a$) depicts Scanning Electron Microscope (SEM) images of the film material of the present invention deposited on Si (100), FIG. 9($b$) on $SiO_2$ and FIG. 9($c$) on PMMA and FIG. 9($d$) on sputter-deposited cobalt, along with insets of corresponding High Resolution Scanning Electron Microscope (HRSEM) images.

In another aspect of the present invention, as shown in FIG. 9, the multi-layered aspect of the film coating, wherein the nanocrystalline zinc ferrite film is deposited on top of a film of nanostructured zinc oxide, which is deposited on silicon initially. The deposition process, when repeated, leads to formation of a multilayered film of desired layer thickness and composition. This example shows that the subject matter of the present invention can be employed to obtain not only thin layers of a ferrite, but also multi-layered films with different compositions in the layers. In other words, by employing the subject matter of the present invention the objective of enhancing the inductance density by enveloping the metal loop (of HFID device), as illustrated in FIG. 1 and FIG. 2, by depositing successive layers of ferrites with different compositions can be achieved. In another exemplary embodiment as shown in FIG. 9 the successive deposition of layers film material of the present invention is demonstrated.

Figure 10:
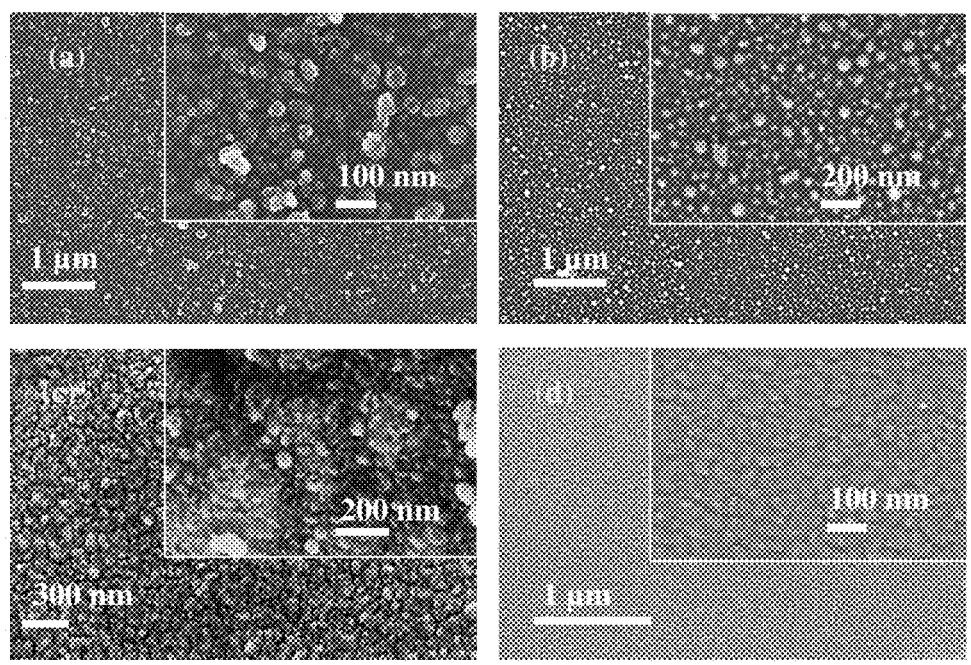
FIG. 10 depicts Scanning Electron Microscope (SEM) images of an exemplary film material of the present invention, depicting the formation of multilayer coatings with controlled thickness and morphology.

In further aspect of the present invention, depositing of magnetic oxide film of the present on other suitable substrates, such as $SiO_2$, polymeric substrates such as Poly (methyl methacrylate) (PMMA), metals, and their combinations other than silicon. Films deposited on different substrates are shown in FIG. 10 (a,b,c and d) where (a) on Si (100); (b) on $SiO_2$ (c) on PMMA and (d) on metal, sputter-deposited cobalt.

These figures show how the morphology of the ferrite film changes as the thickness of the film is increased from about 100 nm to about 1 μm. The deposition of such films on substrates of PMMA, a low-melting polymer, illustrates the effectiveness of the process of the present invention to form adherent and crystalline films of functional oxides (magnetic oxides here) on such substrates, which are often flexible.

Thus, by employing the subject matter of the present invention fabrication of flexible electronic devices can be undertaken.

Figure 11:
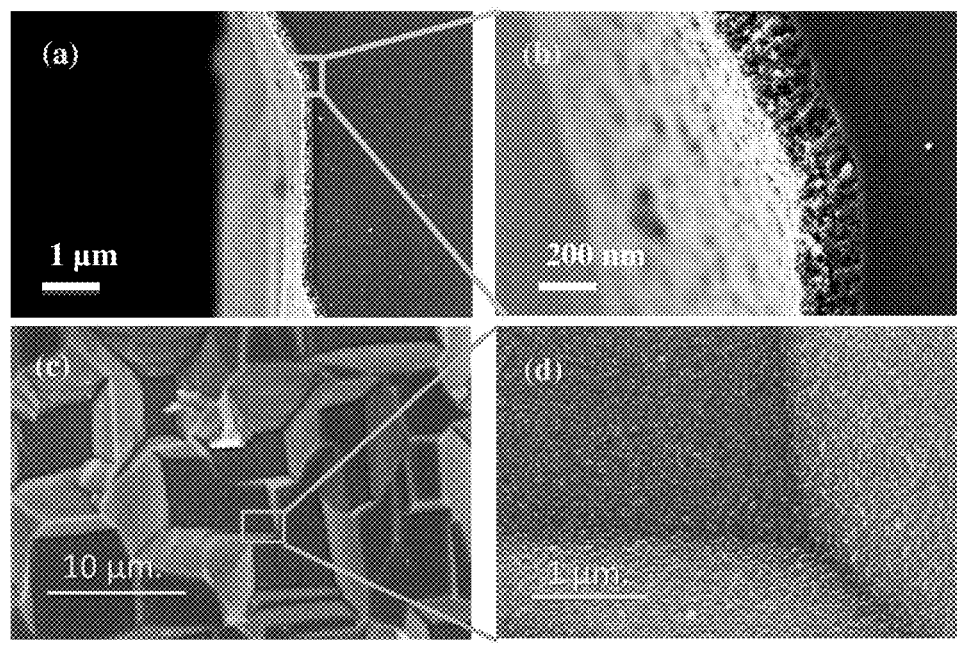
FIGS. 11($a$), ($b$), ($c$), and ($d$) depict Scanning Electron Microscope (SEM) images of an exemplary film material of the present invention deposited on the rough (back) side of a Si(100) substrate with micrometric terrace-like structures.

In another aspect of the present invention SEM images of Zinc Ferrite Thin Film (ZFTF), deposited on the rough (back) side of a Si(100) substrate is shown in FIG. 11. This exemplary embodiment illustrates the capability of the method of the present invention to deposit thin films in a "conformal manner", i.e., the film deposited follows the contours and patterns of the substrate faithfully. Silicon substrates (FIG. 1), used in the fabrication of RFICs today, are polished on the side in which integrated devices are fabricated. As these Si substrates (wafers) are cut from large "boules", the unpolished side retains the "steps" and "pits' characteristic of the crystal structure of Si. These are of dimensions in micrometers. FIG. 11 (c and d) provide a view these "pits" and show how conformally the ferrite layer coats the tiny contours and crevices. As the dimensions of the crevices around the "metal loop" inductors in HFID are comparable, this exemplary embodiment illustrates the capability of the subject matter of the present invention to envelope the metal loop on all possible sides.

Figure 12:
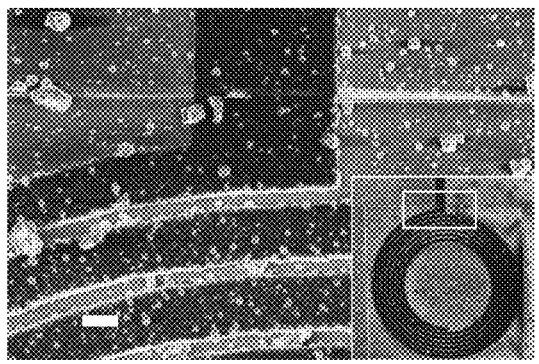
FIG. 12 depict Scanning Electron Microscope (SEM) images of exemplary ferrite-film-coated inductors.
Figure 12:
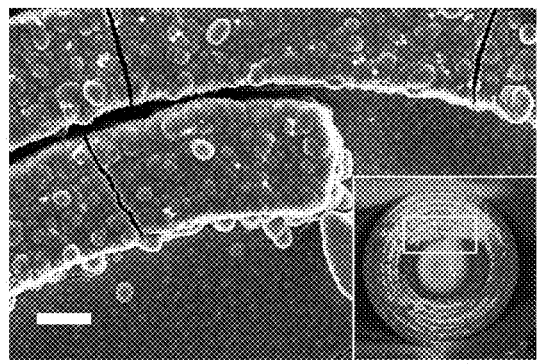
Figure 12:
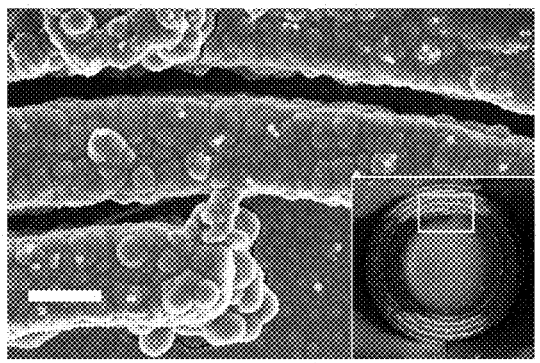
Figure 12:
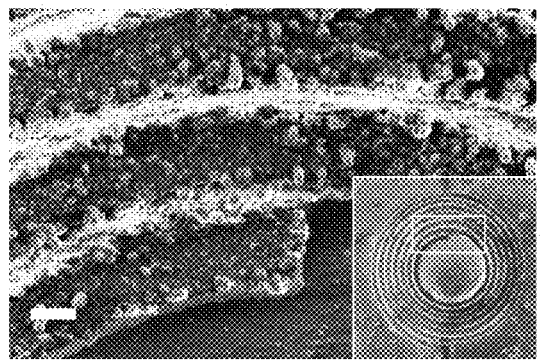

In yet another aspect of the present invention, SEM images of a few ferrite-film-coated inductors are shown in FIG. 12. They show the complete enveloping of the inductor loops, on all exposed sides (i.e., except at the bottom, where the loop "sits" on the substrate), for different thicknesses of the ferrite layer, namely, 250 nm to 1000 nm. The capability for conformal coating of the inductor loop with the ferrite film is vividly illustrated in this Figure. Such complete enveloping of the inductor loop enables the maximum enhancement of inductance density, together with retaining a high quality factor (Q factor).

Figure 13:
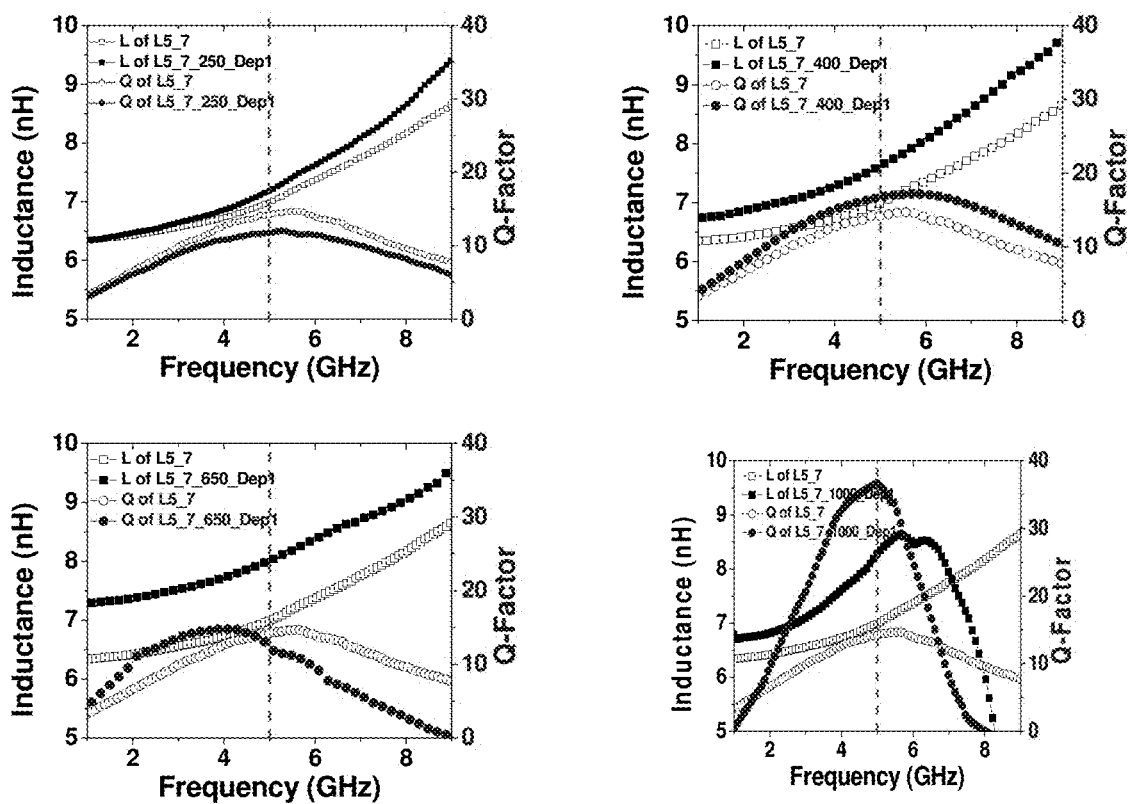
FIG. 13 depicts Inductance (L) and Quality factor (Q) plots of various exemplary devices (induction coils) coated with ferrite film of variable thicknesses (a) 250 nm; (b) 400 nm; (c) 650 nm; and (d) 1000 nm.

In further aspect of the present invention Inductance (L) and quality factor (Q) plots (FIGS. 13a,b,c and d, clockwise from top left) of various HFIDs under 'Configuration-I' are plotted for varying ferrite film thicknesses: (a) 250 nm; (b) 400 nm; (c) 650 nm; and (d) 1000 nm. That is, the ferrite film covers the top of the inductor loop, as illustrated in FIG. 1(a). It is seen from FIG. 13 (a,b and d) that a significant enhancement of inductance due to the deposition of the ferrite film is achieved at 5 GHz, while the Q-factor is retained at acceptable values in FIG. 13 (a and b). The "tuning" of film deposition parameters enables achieving both an enhancement in inductance density and an acceptable Q-factor at a frequency as high as 5 GHz.

Figure 14:
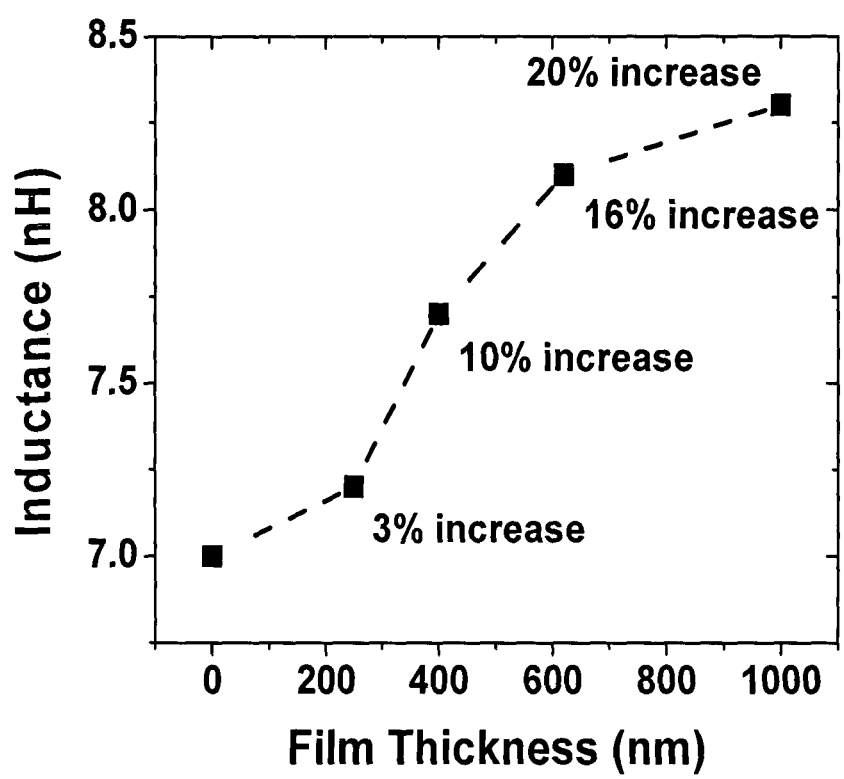
FIG. 14 is a graphical plot depicting the effect of thickness of the ferrite film of the present invention on the enhancement of inductance.

In yet another aspect of the present invention, it is observed that the thickness of the ferrite film has significant impact on the enhancement of inductance. It is also observed that an enhancement of the inductance of up to 20% is achieved when a thicker film is deposited, as demonstrated in the FIG. 14. It is expected that, through encapsulation of the inductor coil both at the top and the bottom, a much higher enhancement of inductance can be readily achieved, even at very high frequencies. The enhancement of inductance achieved by the HFID of present invention at frequency range of 5 GHz to 10 GHz is accompanied by desired quality factors.

In further aspect of the present invention as shown in FIGS. 12,13,14 and 15 an effective ferrite coating, and effective method for obtaining the coating, in achieving inductance density enhancement in HFID. Such enhancement is accompanied by desirable Q-factors. Both of these requirements for HFID are achieved at frequencies up to 10 GHz.

Figure 15:
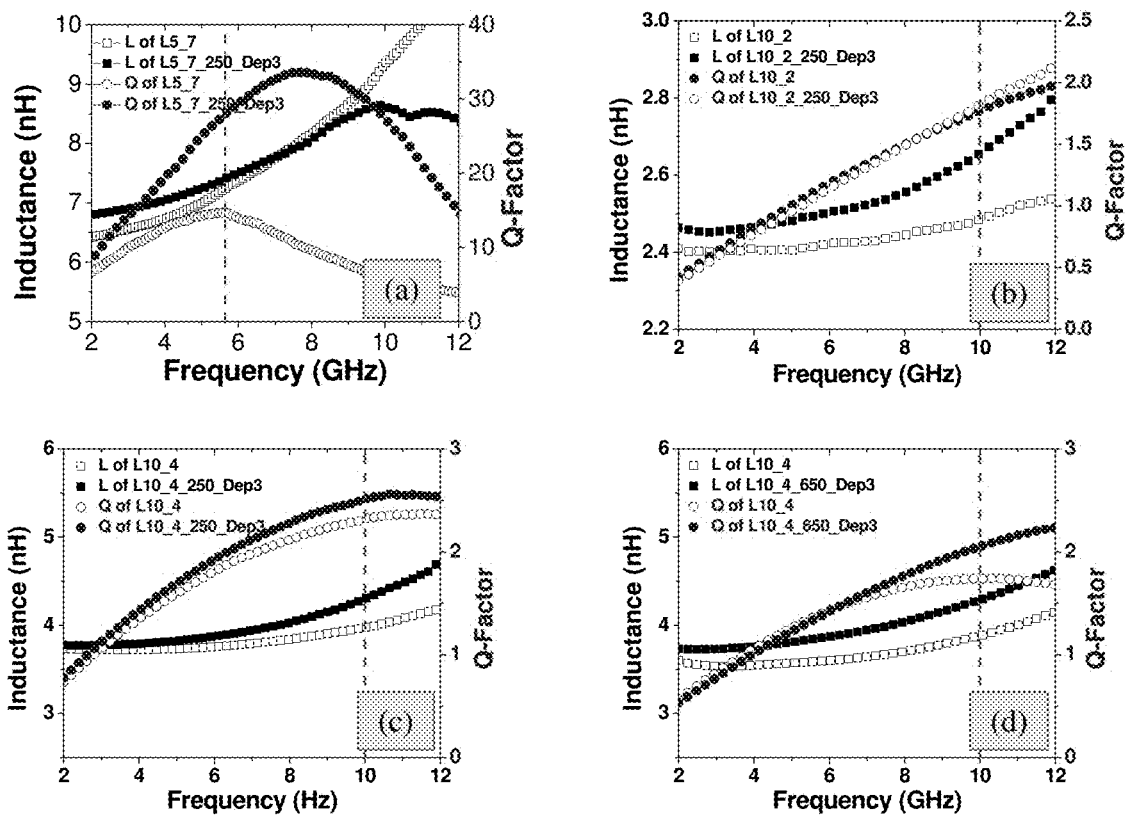
FIG. 15 is a graphical plot depicting Inductance (L) and Quality factor (Q) plots of various exemplary devices. (The detailed descriptions of these devices are given in TABLE-2.)

In yet another aspect of the present invention the ferrite-coated die is characterized using a network analyzer. The s-parameters thus obtained are then processed to extract the inductance of the inductor in the die. An enhancement of inductance by 5% at 5 GHz (above its measured value prior to being coated by the ferrite film) is measured when the thickness of the ferrite film covering the inductor is about 250 nm. This enhancement in inductance without the quality factor (Q-factor) being degraded. is the enhancement in inductance was about 20% when the thickness of the ferrite layer was increased to ~1 micrometer, as demonstrated in FIGS. 10 and 11. Both inductance and the Q-factor of the inductor, designed to have peak quality factor at 10 GHz, were found to be improved on a separate "die", as shown in FIG. 15, where three sides of the inductor coil was wrapped (enclosed) by the ferrite coating, i.e., processed through 'configuration-II', as shown in FIG. 1.

Figure 16:
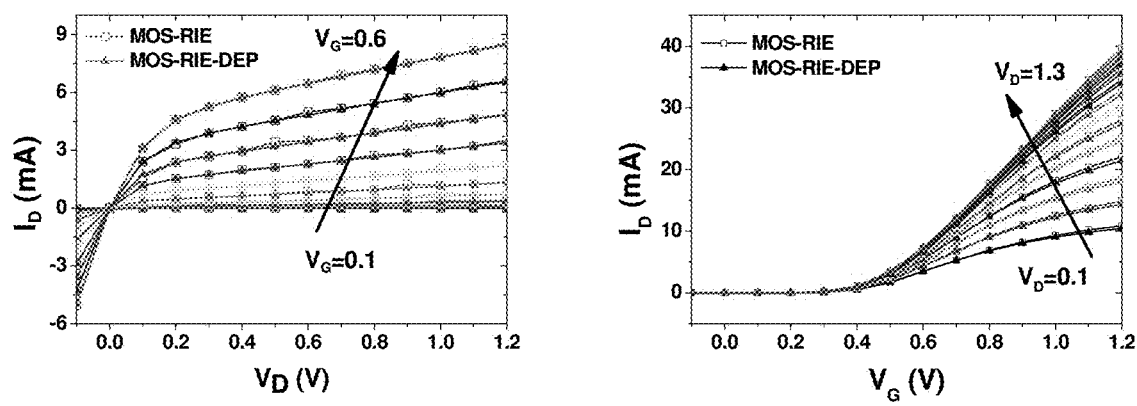
FIG. 16 is a graphical plot depicting DC characteristics of the MOSFET structure before and after the microwave-irradiation-assisted solution processing of the present invention.

In yet another aspect of the present invention CMOS-compatibility of the device of the present invention is verified by testing the MOSFET characteristic of a stand-alone MOSFET device before and after the deposition of ferrite film and the result is demonstrated in FIG. 16. The $I_D$ vs. $V_D$ and $I_D$ vs. $V_G$ plots are standard measures of MOS devices. The MOSFET characteristics are found to be absolutely unperturbed, as demonstrated clearly in FIG. 16. This is illustrated by the complete overlapping of the MOS device characteristics measured before and after the deposition of the ferrite film. The points marked by rectangles in FIG. 16, represent data obtained before ferrite film deposition. The points marked by triangles represent data obtained after ferrite film deposition. It is to be understood here that the use of the aforementioned Discover Lab-mate microwave reactor for the deposition of nanostructured ferrite films is exemplary and does not limit the scope of the present invention. Other suitable microwave reactors, which can accommodate larger substrates required in IC fabrication, may be used where appropriate. Microwave reactors at permitted frequencies other than 2.45 GHz may also be used to perform this invention.

The subject matter of present invention concerns HFIDs, operating at higher frequencies, enabled by thin layers of oxide magnetic material, acting as the core of integrated active and passive members. Thin magnetic layers that are substantially mono-disperse, homogenous, non-porous, flat, and adherent.

In further aspect of the present invention the present invention provides a system, the system comprising a processing unit to receive and transmit a radio frequency (RF) signal, the RF signal being converted to digital data. A voltage regulating member such as Voltage Controlled Oscillator (VCO) and Low Noise Amplifier (LNA) connected to the processing unit, the voltage regulator member having a substrate with at least an on-chip passive member. A ferrite layer bonded to said substrate through an interfacial bridge and substantially wrapping plurality of surfaces of said at least on-chip passive member. The systems where HFID of the present invention can be used are cellular phone systems, satellite communication systems and systems in the domain of RFIC.

The present invention also provides a process for the preparation of HFID the deposition of selected nanostructured material on a substrate at low temperatures, under conditions that do not require vacuum-based apparatus usually used for thin film deposition. The process flow chart of the deposition technique of the present invention is given in FIG. 17.

The process comprises the steps of preparing a solution of metallo-organic precursors in the presence of at least a solvent, which steps is followed by disposing a substrate with at least an on-chip active and passive member, in said solution. The solution is heated under microwave conditions to bond a ferrite layer to said substrate through an interfacial bridge. Finally, wrapping the plurality of surfaces of said at least on-chip passive and active members that are mounted on the substrate with the ferrite layer.

For the deposition of thin films of zinc ferrite by the process steps of the present invention, the β-diketonate metal complexes namely (Zn(II) acetylacetonate and Fe(III) acetylacetonate), are taken in the molar proportion of 1:2 (0.5 mmol:1 mmol) ratio, and dissolved in a solvent mixture of polar and non-polar solvents. The solvent mixture is selected from a combination of lower and higher-molecular weight alcohols. In the present disclosure, as an exemplary embodiment, a mixture of 1-decanol (25 ml) and ethanol (15 ml) is used as a solvent. The alcohol 1-decanol is chosen specifically for its relatively higher boiling point, so as to allow a little higher reaction temperature (than allowed by ethanol alone) when the solution is irradiated with microwaves. The relatively longer carbon chain of 1-decanol allows it to act simultaneously as a surfactant, thus obviating the need for a separate surfactant. The use of a typical surfactant, such as poly(vinylpyrrolidone) (PVP), generally necessitates post-film-deposition annealing at an elevated temperature to eliminate remnant organic moieties from the surfactant. Such high-temperature annealing renders the film deposition process CMOS-incompatible. The use of metal acetylacetonate complexes for forming the ferrite (oxide) material is exemplary. Other metal complexes with metal-oxygen bonds in their molecular structures may alternatively be employed.

The process steps as described above are illustrative in nature and it is within purview of this invention to obtain coatings of any desired ferrite material, by employing any appropriate metallo-organic compound of the metals A and B in the ferrite material of general formula $AB_2O_4$, where A is one of Mn, Ni, Co, Cu, Zn, Cr, Fe or a combination thereof, B is Fe and O is oxygen. Other ferrite materials such as having general formula of $AB_{12}O_{19}$, where A is one of barium or strontium or a combination thereof, B is Fe and O is oxygen, can also be used. It is also to be note here that the process parameters, including the composition of the solvent, the concentration of the solution, the temperature and pressure of the solution under microwave irradiation can be suitably varied.

The film deposition process of the present invention prefers a solvent mixture that is free from water. However, this shall not be construed as a limitation since aqueous solvents can also appropriately used.

The solution for film deposition is prepared by dissolving the metal compounds in the selected solvent mixture, and the desired substrate to be coated with a ferrite film (either Si(100) or the "inductor chip") is immersed in a reaction vessel preferably made of pyrex glass. The deposition process is conducted in a suitable microwave reactor (such as, for example, the Discover Lab-mate, CEM Corp., US), in which the vessel containing the reaction solution and the substrate is placed. The "Discover", for example, is a closed-vessel reactor, in which both the temperature and the pressure is controlled (up to 300° C. and 15 bar, respectively). When the reactant solution is subjected to microwave irradiation (300 W, 2.45 GHz), the solution gets heated. As the temperature of the solution rises, the pressure in the closed vessel increases due to the elevated vapour pressure of the solvent (about 15 bar). This, in turn, raises the boiling point of the solvent, but not beyond 200° C. Under microwave irradiation and at elevated temperature and pressure, reactions occur in the solution, leading to the formation of zinc ferrite, which is deposited on the immersed substrate. The process takes about 90 seconds. It is found that, at the end of the process, the substrate is coated with a thin, uniform film of zinc ferrite (about 200 nm in thickness), wherein the crystallite size is about 5 nm (as deduced from electron microscopy shown in inset of FIG. 6(a). The film is also found by Atomic Force Microscopy (AFM) to be very smooth and flat (shown in FIG. 7) characteristics that are desired for HFID device fabrication.

The process steps of the present invention facilitate a rapid deposition, in the solution medium, of the adherent oxide magnetic material (ferrite) on a substrate, under microwave irradiation conditions and at a temperature in the range of 50-400, preferably about 200.

The process steps of the present invention for a rapid deposition of the adherent film of an oxide magnetic material on a substrate employs as precursors, metal-organic compounds that are non-toxic, dissolved in common alcohols, making the entire film deposition process environment-friendly.

The adherent film of oxide magnetic material of the present invention result from the direct metal-oxygen (M—O) bonds in the molecular structure of the metal-organic compounds used as precursors. This aspect of the film deposition process renders the composition and morphological characteristics of the oxide film predominantly pH-independent.

In the film deposition process of the present invention, wherein appropriate precursors are used, chemical reactions take place in the solution medium under microwave irradiation. Dipolar rotation of each solvent molecule in the electro-magnetic (EM) field of microwaves causes friction that leads to high local temperature within the solution. This results in the formation of the oxide magnetic material rapidly. As the entire solution is under the EM field, the formation of the ferrite moieties, and their nucleation into small crystallites occurs, resulting in finely-structured ferrite films on a substrate immersed in the solution.

In the process of the present invention, chemical reactions in the solution medium occur under conditions away from thermodynamic equilibrium, leading to novel magnetic properties in the resulting oxide magnetic materials (ferrite) materials, often in their nanometric form. One example is the formation of nanocrystalline zinc ferrite with significant room temperature magnetization. This is due to the partial crystallographic inversion that occurs in the spinel structure of zinc ferrite, which occurs during the formation of the film under said conditions.

In the said process, since the deposition of the selected magnetic film takes place in the liquid medium, the film covers patterned features and contours on the substrate substantially and conformally, on a micrometer scale, as in Chemical Vapour Deposition (CVD). It is to be noted that such conformal coverage is particularly important for high-frequency applications, where a complete wrapping of the spiral metal inductor element by the oxide magnetic film is desirable.

An examination of zinc ferrite thin films (ZFTF) deposited on Si (100) substrates by transmission electron microscopy (TEM) demonstrated that the film comprised very small crystallites (FIG. 5(b)). The selected area electron diffraction (SAED) pattern (inset of FIG. 5b) of that film shows rather diffused rings of the spinel structure, attesting to the presence of tiny (nano) crystallites. Detailed examination of the films by X-ray Photoelectron Spectroscopy (XPS) shows that the film deposited is that of zinc ferrite with a partially inverted spinel structure (FIG. 4). That is, $Zn^{2+}$ ions occupy both the tetrahedral and octahedral sites (unlike in "bulk" zinc ferrite, where $Zn^{2+}$ ions would only be at the tetrahedral sites). Such partial inversion is a result of the rapid, away-from-equilibrium nature of microwave-assisted synthesis and the high nucleation density caused by the uniform microwave field acting on the reaction mixture. The presence of magnetic $Fe^{3+}$ on both the 'A' and 'B' sites of the spinel structure enables the strong A-B exchange interaction and thus results in a significant magnetic moment at room temperature (unlike in "bulk" $ZnFe_2O_4$). However, in case the metal that is selected is Fe in place of Zn, the complete inversion of spinel structure can be achieved.

Using the process of magnetic film deposition on HFIDs as disclosed herein, and by engineering the microwave apparatus as known in the relevant art, large-area substrates can be coated at a desired high rate (e.g., 1 μm/min), with compositional uniformity throughout. Furthermore, in the RF inductor with a magnetic core, the magnetic layer must not only be deposited on top of the metal lines but also in between metal inductor lines and on the side walls of the metal. Thus, the present disclosure provides a very conformal coating process, capable of covering sub-micron geometric features, as illustrated by the coverage of the fine features on the unpolished (rough) back side of the Si(100) wafer (shown in FIG. 11). It is seen that the many uneven, but deep, micrometric features are very conformally covered by nanocrystalline ferrite. (As the substrate is immersed in the solution, both sides of a substrate are coated in the said process. This may necessitate removing the coating from that side of the substrate on which it is not desired. Such removal is readily achieved through known chemical etching processes that are also CMOS-compatible.) Crucial to the reliability of any IC is the strong adherence of the films. Despite the low (nominal) temperature at which the process of preparing 'integrated device' works, the films deposited are found to be strongly adherent, as shown by ultrasonication and peel-tape tests. These characteristics make the process appropriate for integration of nanostructured zinc ferrite into the RF inductor structure.

To test the efficacy of the process of deposition of a nanostructured material on an IC device, an on-chip inductor is designed, along with its de-embedding pads, for the fabrication. After its fabrication, the unpackaged "die" is first tested with a single-port network analyzer to obtain the s-parameters, prior to the deposition of a layer of the magnetic ferrite "core". The unpackaged "die" is then glued on to a (1"×1") Si (100) wafer, immersed in the reactant solution prepared for the deposition of a layer of nanocrystalline zinc ferrite, and exposed to microwave radiation. The solution temperature rose to nearly 190° C., and the pressure in the vessel touched about 15 bar. SEM images of the aforesaid device before and after the deposition demonstrate the uniformity of the film deposited. The film so obtained covered the top of the flat surface of the substrate that included various active and passive members in it, and will be called hereafter 'configuration-I'. On the other hand, the film that wrapped around the various three-dimensional features on top of the substrate conformally will be termed 'configuration-II'.

The subject matter of the invention is now illustrated in the form of the following examples. These examples are provided for purpose of illustration and shall not be construed as limiting the scope of the invention.

EXAMPLE 1

Metal-organic precursors (Zn(II) acetylacetonate and Fe(III) acetylacetonate) are the metal complexes that are taken in molar proportions of 1:2 (0.5 mmol:1 mmol) ratio, and dissolved in a solvent mixture. A mixture of 1-decanol (25 ml) and ethanol (15 ml) is used as a solvent. The substrate to be coated with the zinc ferrite film (either Si(100) or the "inductor chip") is immersed in the test tube-like pyrex glass reaction vessel of a microwave reactor (such as, for example, the Discover Lab-mate, CEM Corp., US). It is a closed-vessel reactor, in which both the temperature and the pressure is controlled (up to 300° C. and 200 psi, respectively). When the reactant solution is subjected to microwave irradiation (300 W, 2.45 GHz), the solution gets heated. As the temperature of the solution rises, the pressure in the closed vessel increases due to the elevated vapour pressure of the solvent (about 15 bar). This, in turn, raises the boiling point of the solvent, but not beyond 200° C. Under microwave irradiation and at elevated temperature and pressure, reactions occur in the solution, leading to the formation of zinc ferrite, which is deposited on the immersed substrate in a short period of about 90 seconds. It is observed that, at the end of the process, the substrate is coated with a thin, uniform film of zinc ferrite (about 200 nm), wherein the crystallite size is about 5 nm (as deduced from electron microscopy shown in inset of FIG. 6(a). The film is also found by Atomic Force Microscopy (AFM) to be very smooth and flat (shown in FIG. 7), the characteristics that are desired for device fabrication.

EXAMPLE 2

XPS data are collected at different depths of the film material $ZnFe_2O_4$ commencing from the top surface to the film-substrate interface, through controlled ion milling at every step. A schematic diagram of these ion-milled steps, along with the respective survey spectrum that is gathered at the end of each step, is shown in FIG. 3. Based on the compositional signature evident from the survey spectrum, the thickness of the film is divided into four zones, namely, 'the film surface', 'the body of the film just below the surface', 'the body of the film near film-substrate interface' and 'the interface'. These zones are referred to as Zone-I, Zone-II, Zone-III, and Zone-IV, respectively. The high-resolution XPS spectral lines of the various relevant elements, viz., Si-2p, O-1s, Fe-2p and Zn-2p, are also collected from each zone as shown in FIG. 4. It is observed that silicon is nonexistent on the surface of the film (Zone-I of FIG. 4a), whereas the spectrum for Zone-I (FIG. 4b) reveals the presence of adsorbed moisture on the sample surface. The satellite peak (719.16 eV), ~8.4 eV away from the major $Fe^{3+}$ peak (710.94 eV) of the Fe-2p spectrum (Zone-I, FIG. 4c) attests to the absence of $Fe^{2+}$ which, in turn, confirms the formation of pure zinc ferrite. The occupancy of $Zn^{2+}$ in spinel lattice is determined qualitatively by analyzing the $Zn-2p^{3/2}$ peak position. It is found to be at 1022.2 eV, which lies between the positions designated for $Zn^{2+}$ in the tetrahedral 'A-sites' (1021.3 eV) and the octahedral 'B-sites' (1023.2 eV). De-convolution of the peak reveals that $Zn^{2+}$ is distributed among A and B sites with a larger proportion in A-sites (Zone-I, Error! Reference source not found. (d)), indicating the formation of a partially inverted spinel structure with an inversion factor >0.5. Therefore, the surface of the film comprises pure but partially inverted zinc ferrite, with some adsorbed moisture. Zone-II of the film structure is revealed after ~40 nm of milling below the surface with $Ar^+$ ions (10 min @ 4 nm/min). It is observed that at this depth, the trace of moisture is significantly reduced, with no evidence yet of Si (Zone-II, FIGS. 4 (a) and (b)). Also present in Zone II is a trace of $Fe^{2\pm}$. The peak corresponding to $Zn-2p^{3/2}$ announces partial inversion, but with the inversion factor slightly less than 0.5 (FIG. 4 (d)). Additional XPS spectra by performing ion-milling are gathered at four "depths", each ~40 nm below the previous one. However, no significant difference is observed (as shown in Error! Reference source not found.), attesting to the compositional consistency of the body of the film.

EXAMPLE 3

Metal-organic precursors (Zn(II) acetylacetonate and Fe(III) acetylacetonate) are the metal complexes that are taken in molar proportions of 1:2 ratio, and dissolved in a solvent mixture. A mixture of de-ionized water (50 ml) and ethanol (200 ml) is used as a solvent. The solute concentration was also varied as demonstrated in Table 1. A certain quantity of surfactant, Polyvinylpyrrolidone (PVP), of various types (varying molecular weight) and various concentrations as denoted in Table 1 was mixed to the solution ready for microwave exposure. The entire solution was then transferred to a round-bottom flax along with a piece (1'×1') of Si (100) substrate and then kept inside a 'domestic' microwave oven. When the reactant solution is subjected to microwave irradiation (640 W, 2.45 GHz), the solution gets heated. The temperature of the solution rises rapidly while the pressure of the system remains in atmospheric due to the 'open-vessel' nature of the reaction. The temperature reached the boiling point of the solvent mixture and found not to exceed 200° C. Under microwave irradiation and at elevated temperature, reactions occur in the solution, leading to the formation of zinc ferrite, which is deposited on the immersed substrate in a short period of about 10 minutes. It is observed that, at the end of the process, the substrate is coated with a thin, uniform film of zinc ferrite (of various thicknesses depending on the process recipe as outlined in Table 1). SEM imaging of different films, showing the effect of differing mol. wt. of the surfactant PVP, is shown in FIG. 8. The coatings of zinc ferrite as shown in FIG. 8(a), (b), (c), respectively, indicate the deposition of zinc ferrite films with PVP of mol. wt. 15,000, 55,000, and 360,000, added to the reaction solution, while following the deposition protocol as shown in FIG. 17. The substrate to be coated with the zinc ferrite film (either Si(100) or the "inductor chip") is immersed in the test tube-like pyrex glass reaction vessel of a microwave reactor.

EXAMPLE 4

Metal (II) acetates (Zinc acetate) of 1 mmol was mixed with de-ionized water (20 ml) to form a clear solution in a pyrex tube, specified to be used in the closed-vessel microwave reactor (Discover Lab-mate, CEM Corp., US), and then a small (1 cm×1 cm) piece of Si (100) substrate, properly cleaned through RCA cleaning routine, was immersed into the solution. The reaction vessel was then taken for microwave exposure (300 W, 2.45 GHz) for 2 minutes following the process protocol as depicted in FIG. 17 without following the details of the recipe minutely. A nice whitish coating, characterized as nanocrystalline zinc oxide (ZnO), was observed at the end of the exposure. The coated substrate was then washed by ethanol rinse. Without any further treatment this coated substrate was then immersed into a solution (~20 ml) of metal-organic precursors (Zn(II) acetylacetonate and Fe(III) acetylacetonate) that are taken in molar proportions of 1:2 ratio. The new solution along with the ZnO-coated silicon substrate was exposed to the microwave field (300 W, 2.45 GHz) for 10 minutes in the close-vessel, focused microwave system aforesaid. A brownish coating on the top of whitish ZnO coating was observed. SEM analysis shown in FIG. 9 exhibit the formation of a second layer on top of the first ZnO layer provides the proof of concept for the formation of multilayer coating.

In further aspect of the present invention, wherein HFIDs with ferrite film coatings of variable thickness are shown in Table 1, by varying the process parameters. The parameters employed to deposit the ferrite film on some of the 'integrated RF devices' of both 'configuration-I' and 'configuration-II' are tabulated in Table II.

TABLE 2

ZFTF Deposition description

| Design of the Dies | Device Code | Deposition scheme | Film Thickness (in nm) | Ferrite coated Inductors (Code Name) |
|---|---|---|---|---|
| Die1 (5 GHz Design) | L5_7 | No deposition | — | L5_7 |
| | | Configuration-I Deposited on 1-side (Films with various thicknesses, only on top) | 250 | L5_7_250_Dep1 |
| | | | 400 | L5_7_400_Dep1 |
| | | | 650 | L5_7_650_Dep1 |
| | | | 1000 | L5_7_1000_Dep1 |
| | | Configuration-II: Deposited on 3-sides | 250 | L5_7_250_Dep3 |
| Die2 (10 GHz Design) | L10_4 | No deposition | — | L10_4 |
| | | Configuration-II: Deposited on 3-sides | 250 | L10_4_250_Dep3 |
| | | | 650 | L10_4_650_Dep3 |
| | L10_2 | No deposition | — | L10_2 |
| | | Configuration-II: Deposited on 3-sides | 250 | L10_2_250_Dep3 |

The analyses by XRD, SEM, TEM, and AFM together show that the ferrite films deposited by the process of this invention have uniform and fine grains, uniform thickness, and a high degree of surface smoothness. As well known in the field of semiconductor device fabrication, these characteristics of thin films (coatings) are very important to the successful fabrication of devices, such as HFID, with high yield, reliability, and at low cost.

The present invention provides a high-frequency integrated device with strong adherent layers or film of ferrite and an oxide of a metal bonded to a substrate, exhibiting an enhanced inductance. The magnetic oxide film wrapping the on-chip active and passive members is smooth and with uniform grain size thereby enhancing the magnetization and inductance of spiral metal inductor elements significantly, without degrading the quality factor (Q).

The present invention provides a scalable process for the deposition of thin films of said oxide magnetic materials in a CMOS-compatible manner so that enhanced inductor elements in RF-CMOS ICs can be fabricated, without disturbing the characteristics of the devices fabricated in the previous stages of fabrication of the same chip. The process also obviates the need for post-deposition of thin films at elevated temperatures, thus rendering it CMOS-compatible.

The oxide magnetic coating, the inductor device, and the process of the present invention are demonstrably effective up to at least 10 GHz. By adapting the process of the present invention to the deposition of thin films of hexaferrites or suitable garnets, the frequency range of operation of RFICs can be extended to about 100 GHz.

The present film deposition process enables the use of nanostructured, smooth, thin films of oxide materials, such as hexaferrites, perovskites, and synthetic (magnetic) garnets in the fabrication of ICs such as high-performance RF-CMOS, FRAM, and MRAM devices.

By employing alcohols as solvents and relatively non-toxic metalorganic complexes as precursors (starting materials) in the deposition of the thin film magnetic material, the present invention provides an environmentally safe process as part of RF-CMOS and other IC fabrication technology.

The process of the present disclosure, which does not employ a vacuum-based process, provides a less energy-intensive ("greener") alternative to vacuum-based thin film processes currently employed in the IC industry, which are also very capital-intensive.

It is also understood that the following claims are intended to cover all the generic and specific features of the invention herein described and all statements of the scope of the invention, which as a matter of language might be said to fall therebetween.

We claim:

1. A high-frequency integrated device, comprising:
   (a) a substrate including at least an on-chip active and passive member; and
   (b) a ferrite layer bonded to said substrate through an interfacial bridge and substantially wrapping plurality of surfaces of said at least on-chip active and passive members.

2. The device as claimed in claim 1, wherein the substrate is formed of an element, a compound, or an alloy selected from a group consisting of Silicon (Si), Germanium (Ge) or a combination thereof.

3. The device as claimed in claim 1, wherein the substrate is of flexible material.

4. The device as claimed in claim 1, wherein the on-chip active member is a transistor and the on-chip passive member is an energy storing or dissipating element, preferably an inductor, capacitor, a resistor or a combination thereof.

5. The device as claimed in claim 1, wherein the ferrite layer is nanostructured.

6. The device as claimed in claim 1, wherein the ferrite layer is crystalline, homogenous, smooth with uniform grain size and non-porous.

7. The device as claimed in claim 1, wherein the ferrite layer is of general formula $AB_2O_4$, where A is one of Mn, Ni, Co, Cu, Zn, Cr, Fe or a combination thereof, B is Fe and O is oxygen.

8. The device as claimed in claim 1, wherein the ferrite layer is of general formula $AB_{12}O_{19}$, where A is one of barium or strontium or a combination thereof, B is Fe and O is oxygen.

9. The device as claimed in claim 1, wherein the ferrite is partially or fully inverted.

10. The device as claimed in claim 1, wherein the ferrite layer is preferably a zinc ferrite layer.

11. The device as claimed in claim 1, wherein the interfacial bridge is an oxide formed by the metals in ferrite layer and elements in the substrate.

12. The device as claimed in claim 1, wherein the thickness of the interfacial bridge is in the range of about 0.5 to 2 nm.

13. A method for preparing a high-frequency integrated device comprising:
   (a) preparing a solution of metallo-organic precursors in the presence of at least a solvent;
   (b) disposing a substrate with at least an on-chip active and passive member, in said solution;
   (c) heating the solution under microwave irradiation to bond a ferrite layer to said substrate through an interfacial bridge; and
   (d) wrapping substantially plurality of surfaces of said at least on-chip active and passive members with the ferrite layer.

14. The method of claim 13, wherein the solvent is polar or a combination of polar and non-polar solvents.

15. The method of claim 14, wherein the solvent is selected from long-chain and short-chain alcohols.

16. The method of claim 15, wherein the long-chain alcohol is one of 1-decanol or octanol and the short-chain alcohol is one of ethanol or methanol.

17. The method of claim 13, wherein the metallo-organic precursors are selected from the acetates of Mn, Ni, Co, Cu, Zn, Cr, Fe, Sr and Ba.

18. The method of claim 13, wherein the metallo-organic precursors are selected from the beta-diketonates of Mn, Ni, Co, Cu, Zn, Cr, Fe, Sr and Ba.

19. The method of claim 14, wherein temperature of the solution is in the range of about 50° C. to about 400° C., preferably at about 200° C. and pressure in the range of 1 to 50 bar.

20. A system comprising:
   (a) a processing unit to receive and transmit a radio frequency (RF) signal, the RF signal being converted to digital data;
   (b) a voltage regulating member connected to the processing unit, the voltage regulator member having a substrate with at least an on-chip active and passive member; and
   (c) a ferrite layer bonded to said substrate through an interfacial bridge and substantially wrapping plurality of surfaces of said at least on-chip active and passive member.

21. The system as claimed in claim 20, wherein the substrate is formed of an element, a compound, or an alloy selected from a group consisting of Silicon (Si), Germanium (Ge) or a combination thereof.

22. The system as claimed in claim 20, wherein in the substrate is of flexible material.

23. The system as claimed in claimed in claim 20, wherein the on-chip passive member is an energy storing or dissipating element, preferably an inductor, capacitor, and a resistor.

24. The system as claimed in claim 20, wherein the ferrite layer is nanostructured.

25. The system as claimed in claim 20, wherein the ferrite layer is crystalline, homogenous, with uniform grain size and non-porous.

26. The system as claimed in claim 20, wherein the ferrite layer is of general formula $AB_2O_4$, where A is one of Mn, Ni, Co, Cu, Zn, Cr, Fe or a combination thereof, B is Fe and O is oxygen.

27. The system as claimed in claim 20, wherein the ferrite layer is of general formula $AB_{12}O_{19}$, where A is one of barium and strontium or a combination thereof, B is Fe and O is oxygen.

28. The system as claimed in claim 20, wherein the ferrite layer is partially or fully inverted.

29. The system as claimed in claim 20, wherein the ferrite layer is preferably a zinc ferrite layer.

30. The system as claimed in claim 20, wherein the interfacial bridge is an oxide formed by the metals in ferrite layer and elements in the substrate.

31. The system as claimed in claim 20, wherein the thickness of the interfacial bridge is in the range of about 0.5 to 2 nm.

* * * * *